US007642702B2

(12) United States Patent
Moriya et al.

(10) Patent No.: US 7,642,702 B2
(45) Date of Patent: Jan. 5, 2010

(54) ELECTRON SOURCE, IMAGE DISPLAY APPARATUS, IMAGE REPRODUCING APPARATUS, WIRING BOARD, AND ELECTRONIC DEVICE

(75) Inventors: Masafumi Moriya, Hiratsuka (JP); Kazuya Ishiwata, Yokosuka (JP); Hiroaki Toshima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 276 days.

(21) Appl. No.: 11/767,877

(22) Filed: Jun. 25, 2007

(65) Prior Publication Data

US 2008/0001517 A1 Jan. 3, 2008

(30) Foreign Application Priority Data

Jul. 3, 2006 (JP) ............................. 2006-183700

(51) Int. Cl.
*H01J 1/02* (2006.01)
(52) U.S. Cl. ................... 313/309; 313/496; 313/497; 174/250
(58) Field of Classification Search ............... 313/309, 313/310, 496–497; 445/49–51
See application file for complete search history.

(56) References Cited

U.S. PATENT DOCUMENTS

| 5,905,335 | A * | 5/1999 | Fushimi et al. | 313/495 |
| 6,409,566 | B1 * | 6/2002 | Hasegawa et al. | 445/24 |
| 6,621,207 | B2 * | 9/2003 | Uda et al. | 313/485 |
| 6,653,232 | B2 | 11/2003 | Uda et al. | 438/669 |
| 6,758,712 | B2 | 7/2004 | Kubo et al. | 445/24 |
| 6,803,707 | B2 | 10/2004 | Ishiwata et al. | 313/310 |
| 6,815,884 | B2 | 11/2004 | Yamada et al. | 313/495 |
| 6,853,117 | B2 | 2/2005 | Toshima et al. | 313/304 |
| 6,866,989 | B2 | 3/2005 | Watanabe et al. | 430/394 |
| 6,902,455 | B2 | 6/2005 | Yanagisawa et al. | 445/24 |
| 6,903,504 | B2 | 6/2005 | Watanabe et al. | 313/495 |
| 7,095,168 | B2 | 8/2006 | Meguro et al. | 313/495 |
| 7,211,943 | B2 | 5/2007 | Watanabe et al. | 313/495 |
| 7,264,842 | B2 * | 9/2007 | Watanabe et al. | 427/64 |
| 7,285,428 | B2 | 10/2007 | Uda et al. | 438/4 |
| 2005/0019707 | A1 | 1/2005 | Watanabe et al. | 430/394 |
| 2005/0148269 | A1 | 7/2005 | Uda et al. | 445/6 |
| 2006/0183036 | A1 * | 8/2006 | Sakashita et al. | 430/6 |
| 2006/0194156 | A1 | 8/2006 | Watanabe et al. | 430/394 |

FOREIGN PATENT DOCUMENTS

| JP | 2004-342547 | 12/2004 |
| JP | 2005-216639 | 8/2005 |
| JP | 2005-236006 A | 9/2005 |

* cited by examiner

*Primary Examiner*—Joseph L Williams
*Assistant Examiner*—Brenitra M Lee
(74) *Attorney, Agent, or Firm*—Fitzpatrick, Cella, Harper & Scinto

(57) ABSTRACT

To provide an electron source including: a wiring board having: a substrate provided with a groove on its surface; a first conductive member which is arranged along the groove in the groove; and a second conductive member which is arranged above the first conductive member crossing the first conductive member; and an electron-emitting device which is arranged on the wiring board and is electrically connected to the first conductive member and the second conductive member; wherein a particle is arranged between the first conductive member and an inner wall of the groove.

15 Claims, 11 Drawing Sheets

ELECTRON SOURCE, IMAGE DISPLAY APPARATUS, IMAGE REPRODUCING APPARATUS, WIRING BOARD, AND ELECTRONIC DEVICE

BACKGROUND OF THE INVENTION

1. Field of the Invention

The present invention relates to an electron source, an image display apparatus, an image reproducing apparatus, a wiring board, and an electronic device.

2. Description of the Related Art

A flat panel display such as an LCD and a PDP is a display apparatus having a plurality of pixels arranged in a planar state. By selectively applying a voltage to an electron-emitting device located on each cross portion of a plurality of wirings (matrix wirings) arranged in a matrix or in the vicinity of each cross portion thereof, a flat panel display using an electron-emitting device controls emission of the electron from each electron-emitting device and displays an image.

The matrix wiring is formed by a scan line to which a scan signal is applied and a signal line to which a modulation signal is applied. In recent years, there is a great demand for a display which can display a high-resolution image. Therefore, it is necessary for the wiring to be made narrower, and on the other hand, it is necessary for the film of the wiring to be thick in order to prevent increase of resistance of the wiring due to narrowing of the wiring. In addition, a display which can be made more simply has been required.

As one of solutions for such a request, it is disclosed in Japanese Patent Application Laid-Open No. 2005-216639 and Japanese Patent Application Laid-Open No. 2004-342547 to put a metal wire having a large cross section and a low resistance which has been prepared in advance in a groove disposed on the surface of a substrate and use this for the wiring.

SUMMARY OF THE INVENTION

Disposing a wiring having a large cross section and a wire having a very low resistance (wiring such as a wire provided with a structure like a bulk metal) in a groove of a substrate, due to a difference between a thermal expansion coefficient of the substrate and a thermal expansion coefficient of the wiring, it is feared that peeling-off of the wiring, disconnection of the wiring, and a micro-crack of the substrate may be generated in a heating step or the like.

An object of the present invention is to provide a constitution such that a wiring having a relatively large cross section such as a wire is arranged in a groove disposed on a surface of a substrate, whereby expansion and contraction of the wiring and the substrate in a heating step or the like are absorbed so as to prevent damage to the substrate and the wiring.

(1) An electron source according to the present invention includes: a wiring board including: a substrate having a groove on its surface; a first conductive member which is arranged along the groove in the groove; and a second conductive member which is arranged above the first conductive member crossing the first conductive member; and an electron-emitting device which is arranged on the wiring board and is electrically connected to the first conductive member and the second conductive member; wherein a particle is arranged between the first conductive member and an inner wall of the groove.

(2) In addition, an image display apparatus according to the present invention includes: an electron source according to (1), and a light-emitting member for emitting a light by irradiation with electrons emitted from the electron source.

(3) In addition, an image reproducing apparatus according to the present invention includes: an image display apparatus according to (2), and a receiver, which is connected to the image display apparatus, for receiving at least one of a broadcast signal and a signal transmitted via an electric communication line.

(4) In addition, a wiring board according to the present invention includes: a substrate including a groove on its surface; and a first conductive member which is arranged along the groove in the groove; wherein a particle is arranged between the first conductive member and an inner wall of the groove.

(5) In addition, an electronic device according to the present invention includes the wiring board according to (4).

According to the present invention, expansion and contraction of the wiring and the substrate in a heating step or the like can be absorbed so as to prevent damage to the substrate and the wiring.

DESCRIPTION OF THE EMBODIMENTS

Preferred embodiments of the present invention will be described in detail below with reference to the drawings. However, the scope of the present invention is not limited to measurements, materials, shapes, and their relative positions or the like of constituent parts described in the present embodiment unless particularly described.

According to the embodiment described below, taking an example of arranging a surface conduction electron-emitting device on a wiring board as an electron-emitting device, namely, an example of a substrate of an electron source, the present invention will be described. The surface conduction electron-emitting device is formed by a conductive film having a gap and a pair of electrodes connected to the opposite ends of this conductive film. However, as an electron-emitting device used for an electron source of the present invention, an electron-emitting device having at least two electrodes such as a field emission type electron-emitting device and a metal-insulator-metal type electron-emitting device can be preferably applied. In addition, the wiring board of the present invention (the substrate provided with the wiring) can be used for a substrate of various displays including a liquid crystal display, an organic EL display, and a plasma display. In addition, on the wiring board of the present invention, the above-described electron-emitting device and a functional device such as an EL device and a TFT are arranged, and if they are connected to a first conductive member, it is possible to form various electronic devices such as a display and a circuit.

First Embodiment

With reference to FIGS. 1 to 4, an example of the embodiment of a wiring board will be described. Here, an example of applying the wiring board to the electron source is described, however, as described above, the wiring board according to the present embodiment can be also applied to other electronic device.

Figure 1:
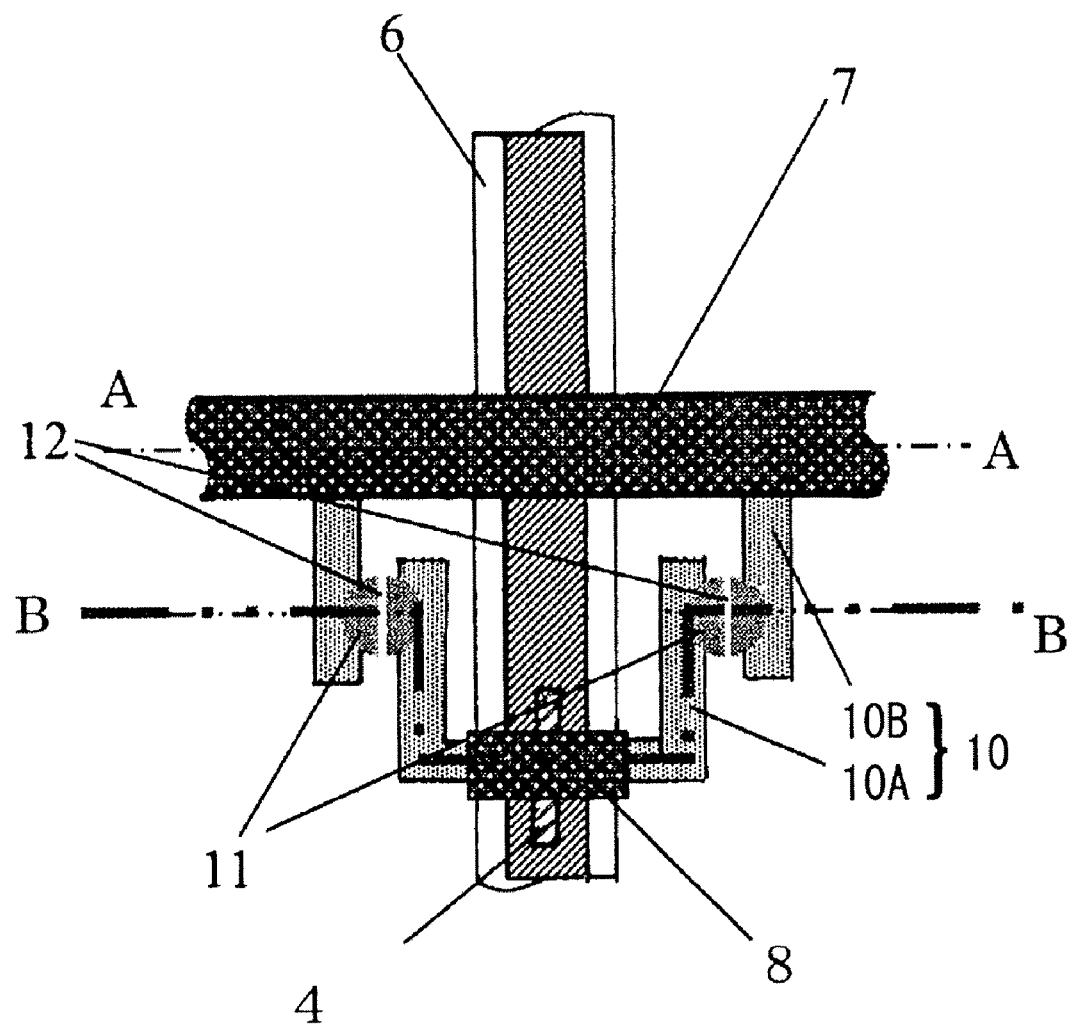
FIG. 1 is a plan pattern diagram according to an embodiment of an electron source.
Figure 2:
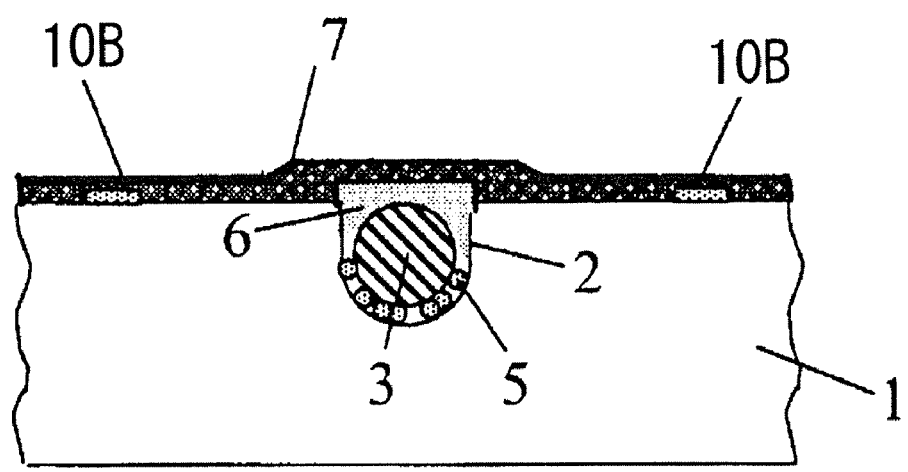
FIG. 2 is a sectional pattern diagram taken on a line A-A of a matrix wiring structure shown in FIG. 1.
Figure 3:
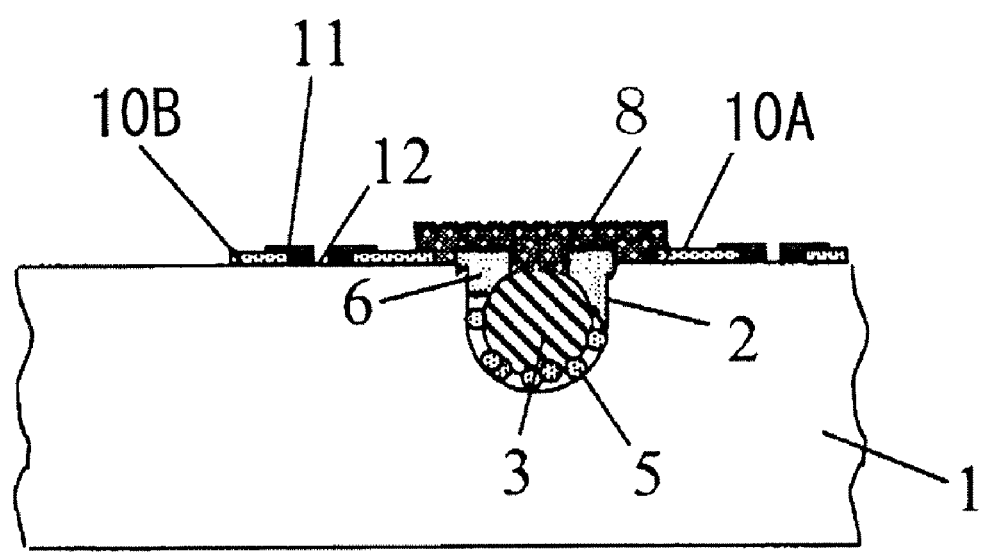
FIG. 3 is a sectional pattern diagram taken on a line B-B of a matrix wiring structure shown in FIG. 1.
Figure 4:
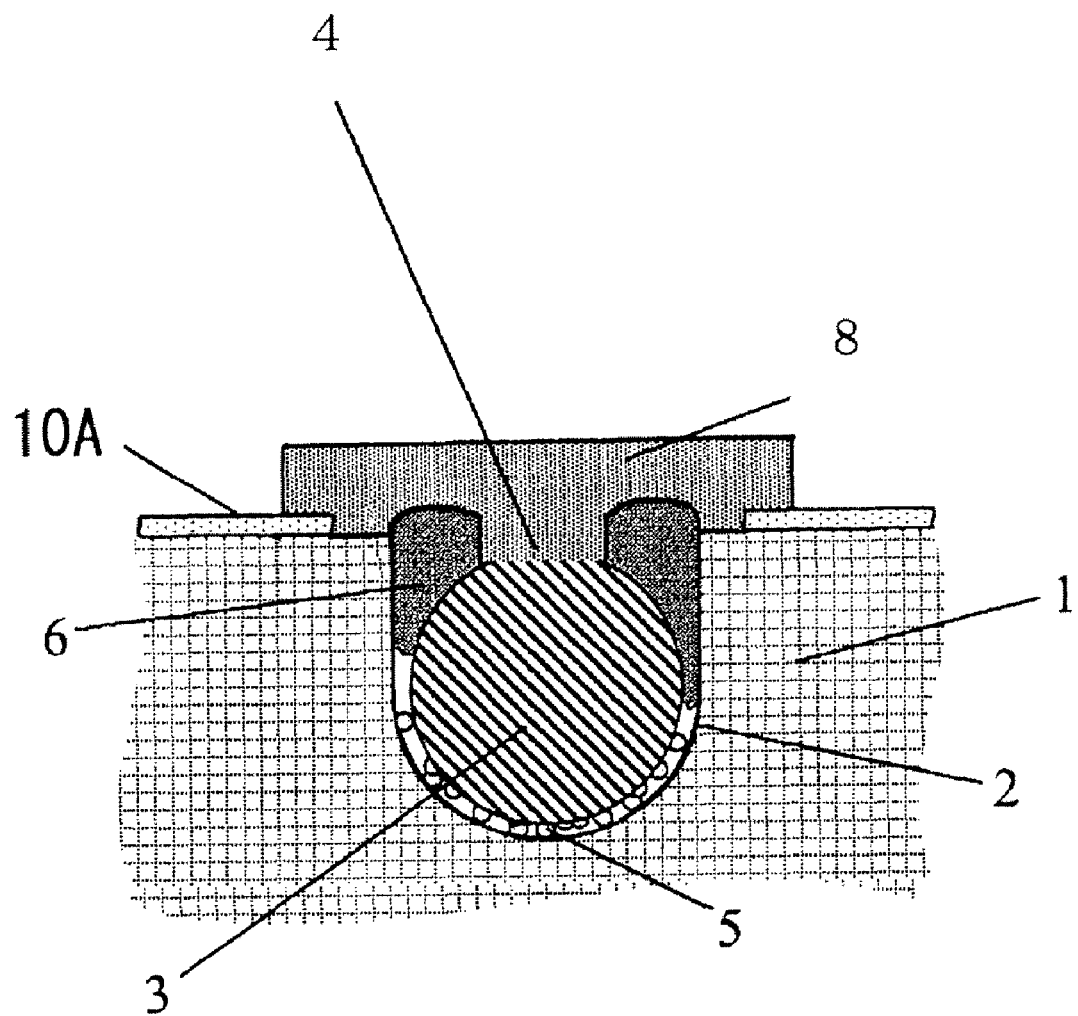
FIG. 4 is an enlarged view of a periphery of a wire shown in FIG. 3.

FIG. 1 is a plan pattern diagram of a part of a wiring board (an electron source) according to the present embodiment, FIG. 2 is a sectional pattern diagram taken on a line A-A of a matrix wiring structure shown in FIG. 1, FIG. 3 is a sectional pattern diagram taken on a line B-B of a matrix wiring structure shown in FIG. 1, and FIG. 4 is an enlarged view of a periphery of a first conductive member 3 shown in FIG. 3.

<Wiring Board>

The wiring board according to the present invention includes at least a substrate 1 provided with a groove 2, a first conductive member 3 that at least a part thereof is arranged in the groove 2 along the groove 2, a second conductive member 7 which is arranged so as to cross the first conductive member 3 above the first conductive member 3, and a particle 5 between the first conductive member 3 and the inner wall of the groove 2. According to an example described below with reference to FIG. 1, the wiring board further includes an exposed portion 4 on the first conductive member 3, a first electrode 8 disposed on the exposed portion 4, and an electrode pair 10 formed by a second electrode 10A and a third electrode 10B. Between the electrode pair 10, a conductive film 11 having a gap 12 is disposed. From this conductive film 11, an electron is emitted.

The wiring board according to the present embodiment can be used as a wiring board, which is particularly used for an electronic device such as a liquid crystal display, a plasma display, and a display using an electron-emitting device.

<Substrate 1>

As a material of the substrate 1, a glass is preferable.

<First Conductive Member 3>

The first conductive member 3 is preferably made of a wire 3 including a metal. A metal is selected from any one of Cu, Al, and Ni. Further, the first conductive member 3 is preferably made of a so-called oxygen-free copper. If the first conductive member 3 is made of an oxygen-free copper, a degree of oxidation can be controlled. The first conductive member 3 is a wiring and is connected to the second electrode 10A of the electrode pair 10 by the first electrode 8. As the shape of the wire 3 including a metal, a circle section or a rectangular section is used, however, it is not particularly limited. The wire with a circle section can be easily obtained and particularly, this can be preferably applied because a wire rod which is commercially available as a bonding material for an IC or the like in general and a wire rod for an enamel wire can be used. In the case of using a wire of a predetermined measurement, a wire made of a publicly-known drawing machine may be used.

The first conductive member 3 may have a form such that the upper end of the first conductive member 3 is slightly projected from the interior part of the groove 2 (namely, the form such that the upper end of the first conductive member 3 is higher than the surface of the substrate). In other words, the diameter of the first conductive member 3 may be slightly larger than the depth of the groove 2. However, it is preferable that the first conductive member 3 may have a form the first conductive member 3 completely put in the groove 2 (namely, a form such that the upper ends of the surface of the substrate 1 and the first conductive member 3 are aligned or a form such that the upper end of the first conductive member 3 is lower than the surface of the substrate 1). In other words, it is preferable that the diameter of the first conductive member 3 is not more than the depth of the groove 2.

<Second Conductive Member 7>

The second conductive member 7 is arranged above the first conductive member 3 crossing the first conductive member 3. The second conductive member 7 is a wiring to be connected to the third electrode 10B of the electrode pair 10. Then, the second conductive member 7 is connected to the third electrode 10B by covering a part of the third electrode 10B arranged on the surface of the substrate 1. It is preferable that the second conductive member 7 is formed by printing and burning a conductive paste (a paste containing many metal particles).

<Particle 5>

Many particles 5 are arranged between the first conductive member 3 and the inner wall of the groove 2. The particles 5 can serve to support the first conductive member 3 disposed in the groove 2 by points. As a material of the particle 5, a material of which value of a thermal expansion coefficient is defined between a value of a thermal expansion coefficient of the substrate 1 (for example, $83\times10^{-7}$/K in glass) and a value of a thermal expansion coefficient of the first conductive member 3 (for example, $16.8\times10^{-6}$/K in a copper wire) is used. As the particle 5, a material having a lower conductivity than that of the first conductive member 3 is preferable, and particularly, an insulator is preferable. As such a material, a silicon oxide (typically, a silica) and alumina are preferably used. The particle 5 shaped in a true spherical form or a spherical form or polygonal form can be used. In addition, its particle diameter is smaller than the width and the diameter of the first conductive member 3, and it is preferable that the diameter is in a practical range, namely, in the range of not less than 0.01 μm and not more than 5 μm, depending on the shape of the first conductive member 3 and the shape of the groove 2. By disposing many particles 5 of this type between the inner wall of the groove 2 and the first conductive member 3, at least some of many particles 5 may contact the first conductive member 3. As a result, it is possible to prevent the first conductive member 3 and the substrate 1 (the inner wall of the groove 2) from directly contacting in a wide range. In other words, it is possible to form a place (region) where the inner wall of the groove 2 and the first conductive member 3 are separated. Therefore, it is possible to prevent peeling-off of the first conductive member 3 from the interior part of the groove 2 and generation of a micro crack in the inner wall of the groove 2 or the like due to a thermal expansion and contraction of the substrate 1 and the first conductive member 3 even if the thermal expansion coefficient of the first conductive member 3 is largely different from the thermal expansion coefficient of the substrate 1. It is preferable that the particle 5 is fixed in the groove 2 by an adhesive agent. For example, many particles 5 are arranged in the groove 2, and then, applying the adhesive agent above the particle 5, the particle 5 can be also fixed in the groove 2. In such a case, the particle 5 may be covered with the adhesion agent and the particle 5 may be located in the layer of the adhesive agent. However, if the surface of the adhesive agent is provided with a concavity and a convexity in response to the shape of the particle 5 (the particle diameter), it is possible to prevent the first conductive member 3 and the substrate 1 (the inner wall of the groove 2) from directly contacting in a wide range. On the other hand, it is preferable that the first conductive member 3 and the particle 5 are not fixed by the adhesive agent or the like.

The particle 5 also includes a function as a buffer material for easing a crack and breaking of the substrate 1, and breaking and peeling-off of the first conductive member 3 due to a difference between a thermal expansion coefficient of the substrate 1 made of a glass or the like and a thermal expansion coefficient of the first conductive member 3 made of a wire or the like in a heating step such as a burning step which is practiced after disposing the first conductive member 3 in the groove 2.

<Insulating Layer 6>

An insulating layer 6 is an insulating layer which is disposed between the first conductive member 3 and the second conductive member 7. Upon disposing the second conductive member 7 over the first conductive member 3 so as to cross the first conductive member 3 (upon forming a matrix wire), the insulating layer 6 is disposed between at least the first conductive member 3 and the second conductive member 7. According to the configurations shown in FIGS. 1 to 4, the insulating layer 6 is disposed so as to cover the first conductive member 3 along the first conductive member 3. However, the insulating layer 6 is at least disposed on the first conductive member 3 and on a cross portion with the second conductive member 7. In other words, the insulating layer 6 may be disposed so that the first conductive member 3 and the second conductive member 7 do not cause a short circuit. The insulating layer 6 may be disposed in other process than a process of disposing the first conductive member 3 and the insulating layer 6 may be formed by oxidizing the surface of the first conductive member 3 in advance. As a material of the insulating layer 6, a silicon oxide and a metallic oxide forming the first conductive member 3 may be also available. According to an example to be described later with reference to FIGS. 5 to 7, the insulating layer 6 can be also made of an oxide film (an oxide coating) formed by oxidizing the surface of the first conductive member 3 which is a conductive wire containing a metal. In addition to usage of the wire having a surface oxidizing coating, the insulating layer 6 can be disposed. Further, as a wire covered with the oxide coating, a wire having an oxide coating as other member than that of the wire on its surface and a wire of which surface is oxidized (namely, a wire that a wire itself has a surface oxide coating) can be applied. Further, in the wire formed by oxidizing the surface of the wire, an oxidization degree thereof is easily changed step by step from the surface of the wire toward the center of the wire. Therefore, the configuration that the wire itself has the surface oxide coating may include "the configuration that the wire and the oxide coating do not have a clear boundary" or "the wire having the surface oxide coating". Further, "the wire" does not mean a wiring which is directly formed (molded) on the substrate by accumulating the wiring material on the substrate according to a spatter method, an application method or the like, but it means a wire which has been formed in advance on other place (the place other than the substrate), and typically, "the wire" means a member such as a metallic wire. In the case of providing the insulating layer 6 other than the first conductive member 3, it is preferable that the insulating layer 6 may be formed by printing and burning the insulating paste.

<First Electrode 8, Second Electrode 10A>

The first electrode 8 is a connection electrode for connecting the first conductive member 3 to the second electrode 10A, and is connected to the portion which is the surface of the first conductive member 3 and is not covered with the insulating layer 6 (referred to as "the exposed portion 4" as a contact portion). Further, in the case of composing the insulating layer 6 by the oxide film of the first conductive member 3, the exposed portion 4 can be disposed by removing a part of the oxide coating (the insulating layer 6) due to polishing or the like. As a method of removing a part of the oxide coating, not only the polishing but also a publicly-known etching method can be used.

The electrode pair 10 is arranged on the surface of the substrate 1 located in the vicinity of the groove 2.

<Conductive Film 11>

The conductive film 11 is provided with the gap 12. In order to explain the example using a surface conduction electron-emitting device is used as an electron-emitting device, according to the example to be described here, the conductive film 11 provided with the gap 12 is used. The minimum constituent elements of the field emission type electron-emitting device are a cathode electrode and a gate electrode, so that in the case of using the wire substrate of the present embodiment for the electron source, the conductive film 11 is not always necessary.

MODIFICATION EXAMPLE 1

<Silicon Oxide Layer 9>

Figure 5:
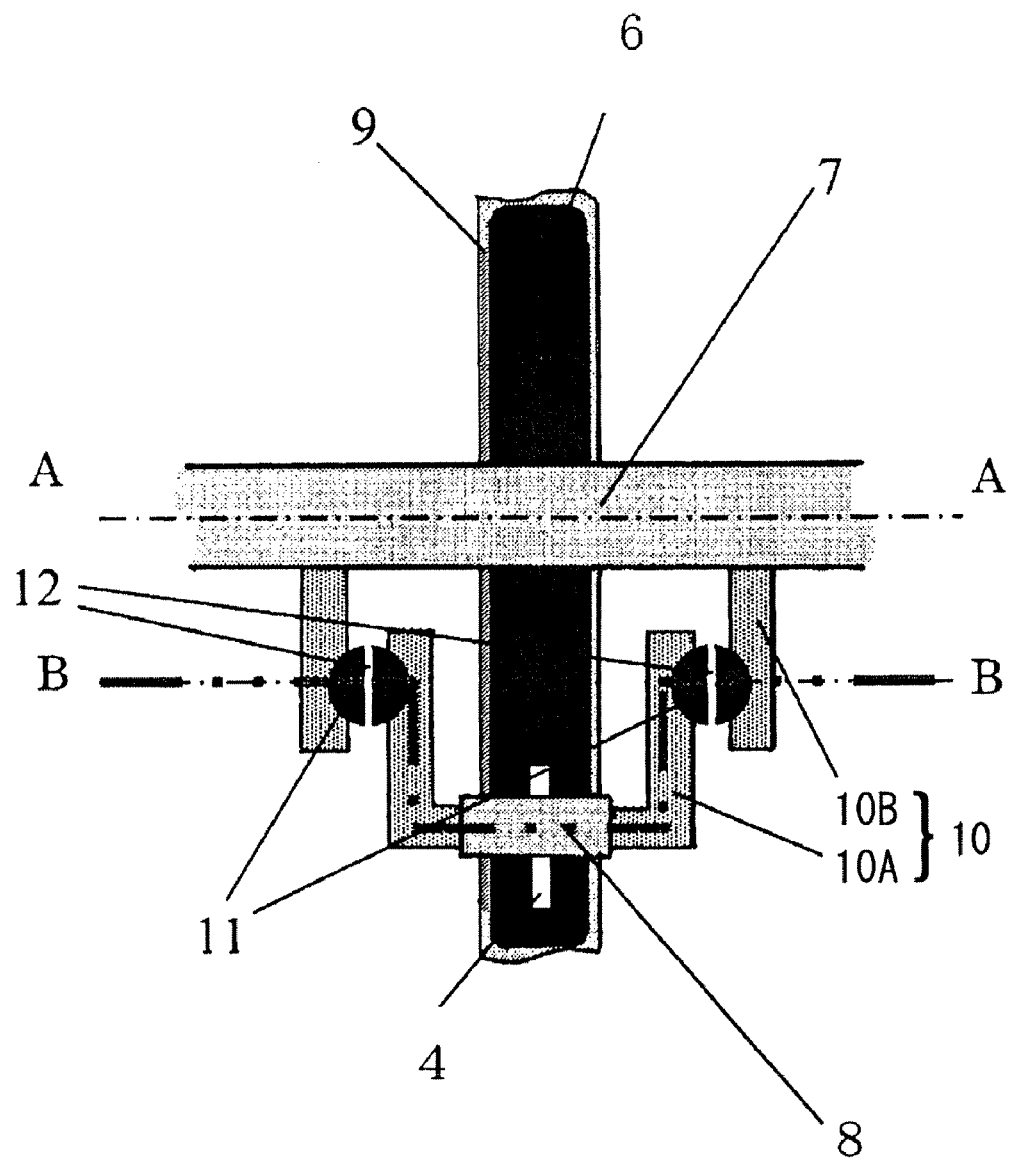
FIG. 5 is a plan pattern diagram according to an embodiment of an electron source.
Figure 6:
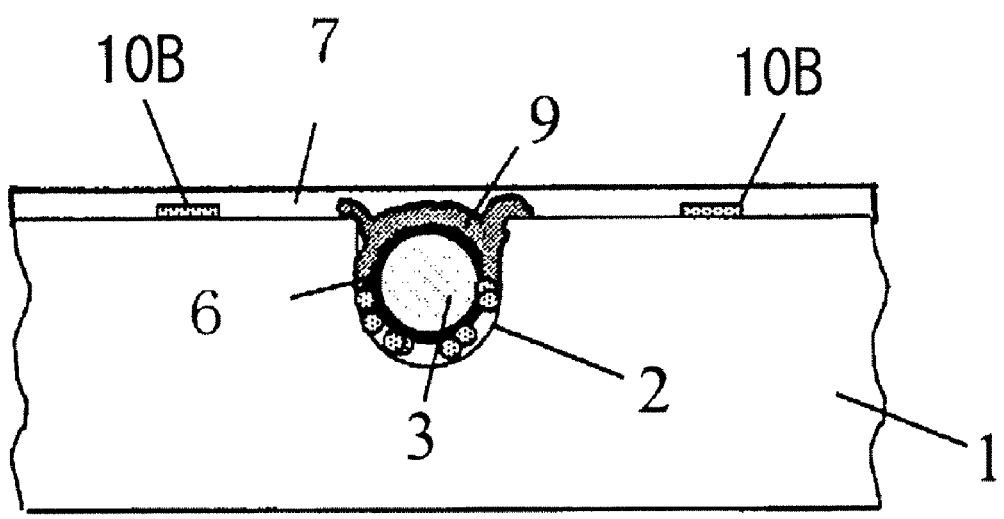
FIG. 6 is a sectional pattern diagram taken on a line A-A of a matrix wiring structure shown in FIG. 5.
Figure 7:
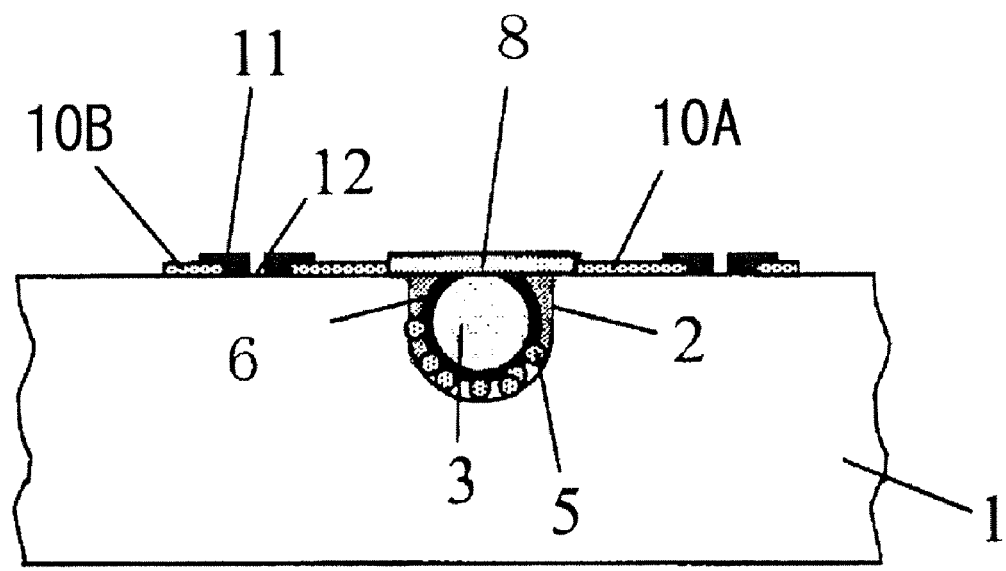
FIG. 7 is a sectional pattern diagram taken on a line B-B of the matrix wiring structure shown in FIG. 5.

As the configuration shown in FIGS. 5 to 7, by disposing the insulating layer 6 between the second conductive member 7 and the first conductive member 3, the insulation between the second conductive member 7 and the first conductive member 3 can be maintained. According to the configuration shown in FIGS. 5 to 7, further, a silicon oxide layer 9 as the second insulating layer is disposed between the first conductive member 3 and the second conductive member 7 in order to improve a dielectric strength voltage. It is preferable that the silicon oxide layer 9 is formed being burned after printing an insulating paste as same as the insulating layer 6. The second insulating layer and the insulating layer 6 can be formed by the same material. In addition, it is preferable that the insulating layer 6 is made of a silicon oxide but other insulating material may be used. Further, the insulating layer 6 may be formed as the oxide coating having the surface of the first conductive member 3 oxidized.

The configuration such that the silicon oxide layer 9 is arranged on the surface of the substrate 1 around the groove 2 and surface conduction electron-emitting device (particularly, the conductive film 11 provided with the gap 12) is arranged on the silicon oxide layer 9 may be also available. According to such a configuration, it is possible to ease an influence of diffusion of the constituent substance of the substrate 1 (for example, Na or the like) given to an electron emitting property of the electron-emitting device of the surface conductive type.

MODIFICATION EXAMPLE 2

In the configuration described here, the electron-emitting devices are arranged right and left of one first conductive member 3, however, the electron-emitting device can be arranged only on one side of one first conductive member 3.

<Electron Source>

In addition, by disposing a plurality of units shown in FIGS. 1 and 5 on the substrate 1 in a matrix, it is possible to form an electron source having a plurality of electron-emitting devices arranged in a matrix.

<Image Display Apparatus>

Figure 8:
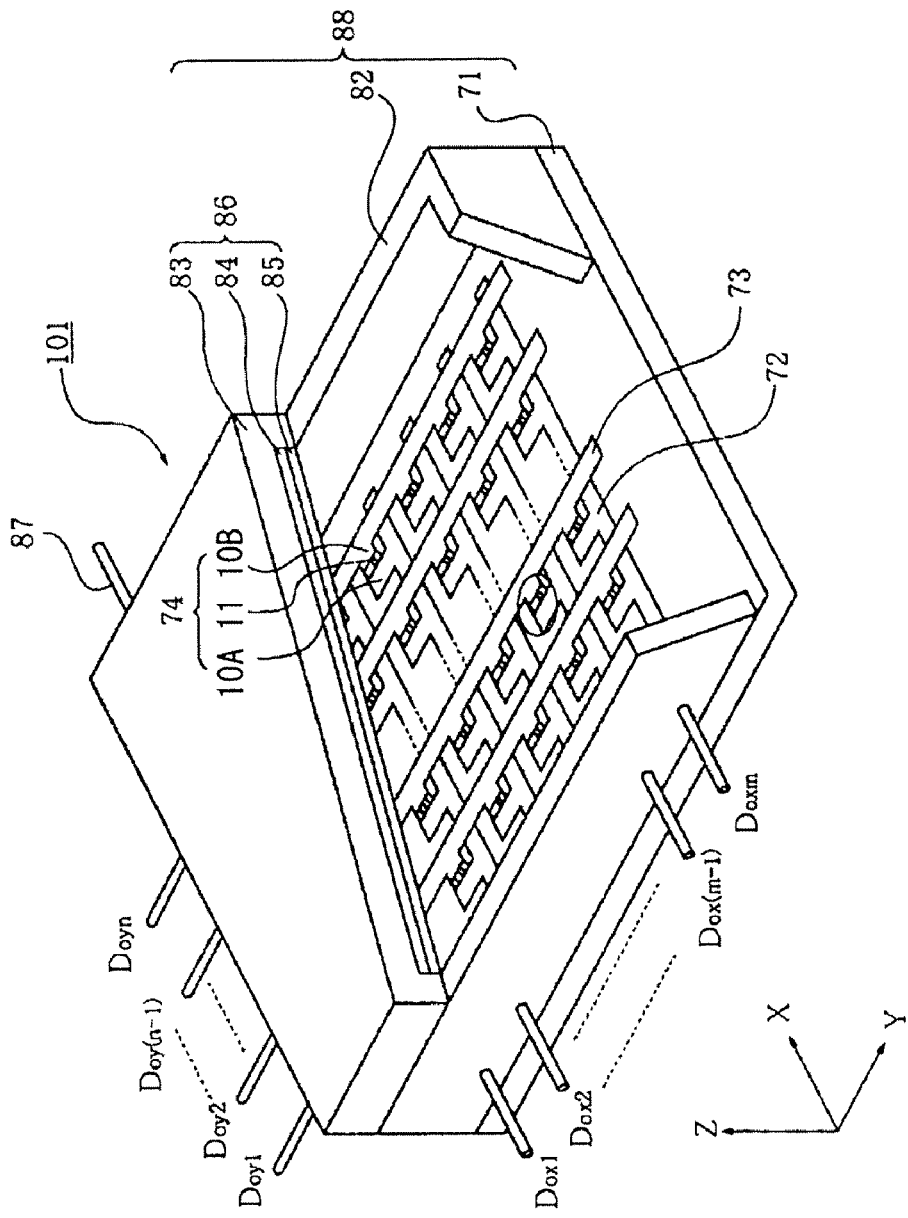
FIG. 8 is a paternal perspective view of an image display apparatus according to the present invention.
Figure 9:
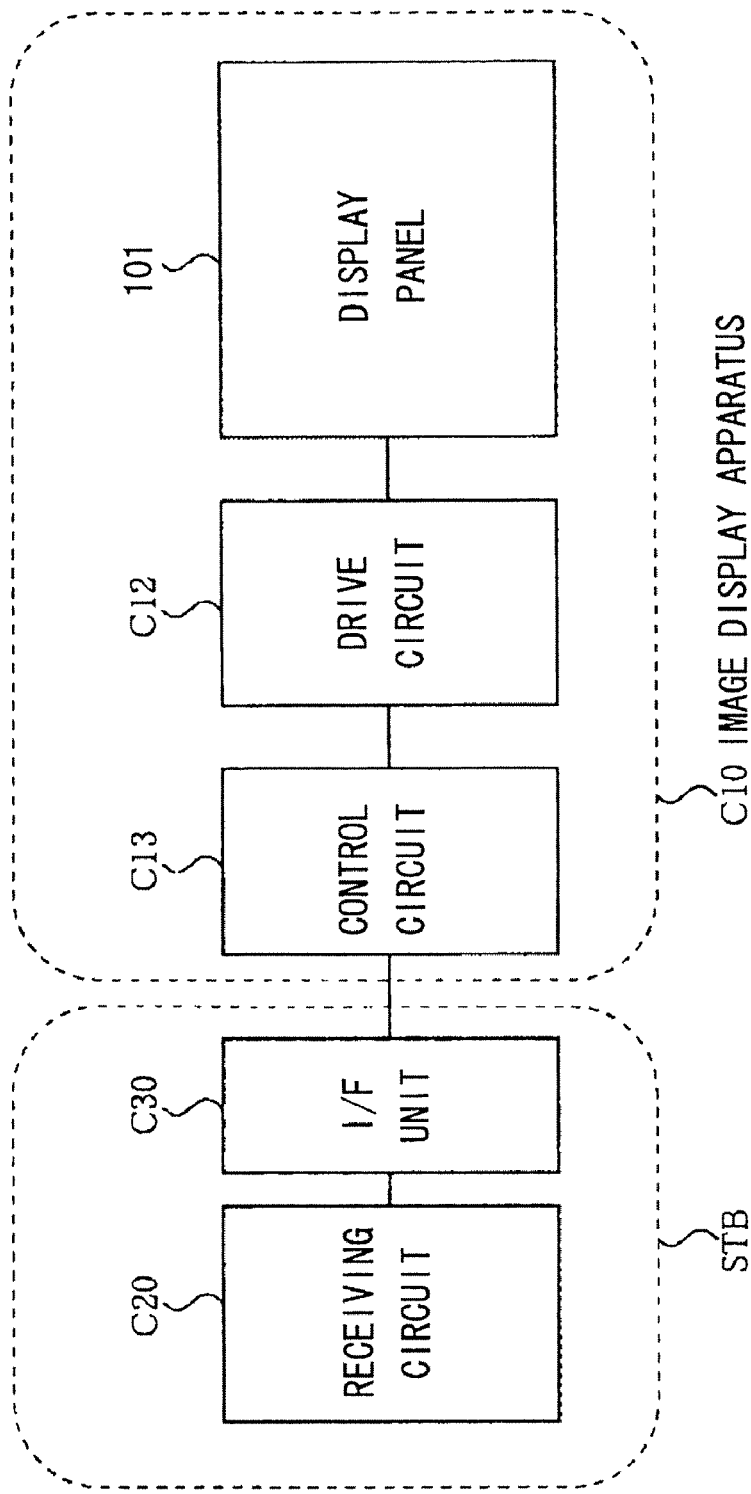
FIG. 9 is a block diagram of a television to which the image display apparatus according to the present invention can be applied.

FIG. 8 shows an example of a display panel 101, which is provided with an electron source having a plurality of electron-emitting devices arranged in a matrix. An X-directional wiring 72 is equivalent to the first conductive member 3 and is a Y-directional wiring 73 is equivalent to the above-described second conductive member 7. An electron-emitting device 74 is composed of a pair of electrodes 10A and 10B and the conductive film 11 having an interval. A rear plate 71 is equivalent to the above-described substrate 1. A reference numeral 86 denotes a face plate, and a light-emitting member film 84 (equivalent to "a light-emitting member" according to the present invention), which emits a light when an electron ray is irradiated, and an anode electrode 85 are disposed on the surface of a glass substrate 83. A support frame 82 is provided between a rear plate 71 and a face plate 86. A container 88, of which interior part is kept vacuum is composed by the rear plate 71 and the face plate 86. To each of the X-directional wirings 72, terminals (Dox1 to Doxm) are connected, and in the same way, to each of the Y-directional wirings 73, terminals (Doy1 to Doym) are connected. To the anode electrode 85, a terminal 87 to be connected to a high-voltage power supply is connected. As shown in FIG. 9, an image display apparatus C10 is formed by the display panel 101, a drive circuit C12, and a control circuit C13.

<Image Reproducing Apparatus>

In addition, an image reproducing apparatus can be formed by using an image display apparatus of the present embodiment (for example, C10 of FIG. 9) and a receiver (for example, C20 of FIG. 9) for receiving at least one of a broadcast signal and a signal transmitted via an electric communication line.

Specifically, the image reproducing apparatus is provided with a receiver (including a tuner for selecting a received signal) so as to output a signal included in the selected signal to the display panel 101 to be displayed or reproduced on a screen. The receiver can receive a broadcast signal such as a TV broadcasting service. In addition, the signal included in the selected signal includes at least one of video information, text information, and audio information. Further, "the screen" is equivalent to the light-emitting member film 84 in the display panel 101 shown in FIG. 8. Based on this constitution, it is possible to form the image reproducing apparatus such as a television set. It is obvious that the image reproducing apparatus according to the present embodiment can include a decoder in the case that the broadcast signal is encoded. The audio signal is reproduced by synchronizing the video information displayed on the display panel 101 with the text information being outputted to audio reproducing means such as a speaker which is separately disposed.

A method of outputting the video information or the text information to the display panel 101 and displaying and/or reproducing them on the screen can be carried out, for example, in the following manner. At first, an image signal in response to each pixel of the display panel 101 is generated from the received video information and text information. Then, the generated image signal is inputted in the drive circuit (C12 of FIG. 9) of the display panel 101. Then, controlling a voltage to be applied to each electron-emitting device in the display panel 101 from the drive circuit based on the image signal inputted in the drive circuit, the image is displayed.

<Television Apparatus>

FIG. 9 is a block diagram of a television apparatus, which is an example of the image reproducing apparatus. A receiving circuit C20 is composed of a tuner and a decoder or the like and receives a television signal of a satellite broadcast and a terrestrial broadcast or the like and a data broadcast or the like via an electric communication line such as a radio communication network, a telephone line network, a digital line network, an analog line network, and Internet connected through a TCP/IP protocol or the like and outputs the decoded video data to an I/F unit (interface unit) C30. The I/F unit C30 converts the video data into the image data of a display format of the image display apparatus C10 and outputs it. The image display apparatus C10 includes the display panel 101, the drive circuit C12, and the control circuit C13. The control circuit C13 applies the image processing such as correction processing suitable for the display panel 101 to the inputted image data and outputs the image data and various control signals to the drive circuit C12. The drive circuit C12 outputs the drive signal to the first conductive member 3 and the second conductive member 7 of the display panel 101 (refer to Dox1 to Doxm and Doy1 to Doyn of FIG. 8) based on the inputted image data, and then, a television picture is displayed. The receiver C20 and the I/F unit C30 may be housed in a case different from the image display apparatus C10 as a set top box (STB) or may be housed in the same case as the image display apparatus C10.

In addition, the image reproducing apparatus can be provided with an interface for connecting the image reproducing apparatus to an image recording apparatus or an image output apparatus, such as a printer, a digital video camera, a digital camera, a hard disk drive (HDD), and a digital video disk (DVD). This makes it possible to display the image recorded in the image recording apparatus on the display panel 101. In addition, this makes it possible to process the image displayed on the display panel 101 according to need and to output it to the image output apparatus in the image reproducing apparatus (for example, a television).

Here, the constitution of the image reproducing apparatus is merely an example and various modifications are possible based on a technical idea of the present invention. In addition, various image reproducing apparatuses can be formed by connecting the image reproducing apparatus according to the present embodiment to a television conference system and a system such as a computer.

<Manufacturing Method of Wiring Board and Electron Source>

Next, a wiring board according to the present embodiment and a manufacturing method of an electron source by using the wiring board will be described below with reference to FIG. 10. According to the following example, a glass substrate 1 can be used as the substrate 1, and the wire 3 is used as the first conductive member 3.

(Step 1)

Figure 10A:
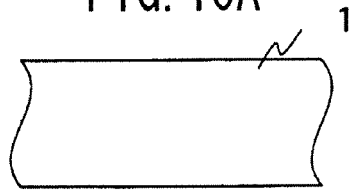
FIGS. 10A to 10I are pattern diagrams showing a manufacturing step of an electron source according to the present invention.
Figure 10B:
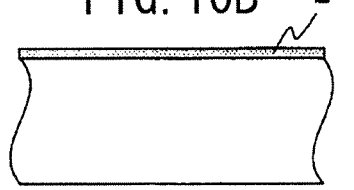

At first, preparing the glass substrate 1, a photosensitive resist 21 is accumulated on the surface of the glass substrate 1 (FIG. 10A and FIG. 10B).

As the resist 21, a dry film resist (DFR) or a liquid resist is used. Particularly, the dry film resist is preferably used.

(Step 2)

Figure 10C:
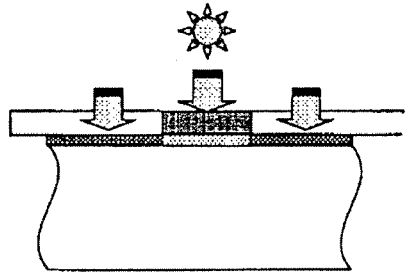
Figure 10D:
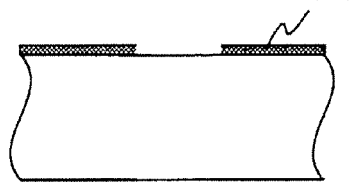

Consequently, the resist is exposed and developed according to a photography method so that the portion which is a part of the surface of the glass substrate 1 and on which the groove 2 is formed is only exposed (FIG. 10C and FIG. 10D).

(Step 3)

Figure 10E:
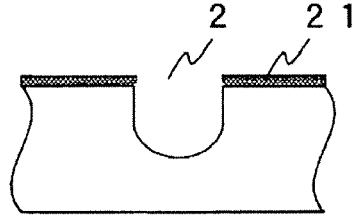

Then, the groove 2 is formed on the surface of the exposed glass substrate 1 (the portion where the groove 2 is formed) (FIG. 10E).

As a method for forming a groove 2, a publicly-known method such as a wet etching and a dry etching can be used. However, it is preferable to use a sand blast method, since the inner wall of the groove 2 formed by a sand blast method has moderate asperity to increase the above-described effect of the particle 5 (for example, the function as the buffer material).

(Step 4)

Figure 10F:
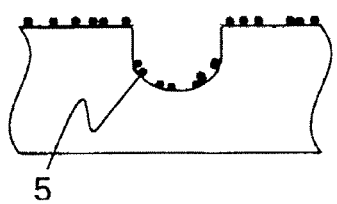

Consequently, many particles 5 are arranged in the groove 2 after the resist 21 is removed (FIG. 10F).

As a particle 5, the particle 5 of the silicon oxide can be preferably used, however, the material of the particle 5 is not limited to the silicon oxide. In FIG. 10F, the particles 5 are arranged across the entire surface of the glass substrate 1, however, they may be arranged only in the groove 2.

(Step 5)

Figure 10G:
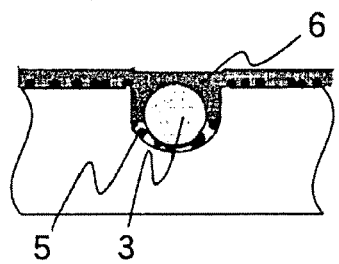

Consequently, the conductive wire 3 containing a metal is arranged in the groove 2 as the first conductive member 3, of which diameter is smaller than the width of the groove 2. Then, the insulating layer 6 is formed so as to cover the wire 3 (FIG. 10G).

As the wire 3, a wire mainly composed of a metal can be used and any one of Al, Cu, and Ni can be preferably used as a metal. As a Cu wire, an oxygen-free copper wire is preferably used, which can control a degree of oxidation. Here, an example using a metal wire will be described, however, the first conductive member 3 is not limited to the metal wire and the conductive member (the wiring) which has been formed in advance and can be disposed in the groove 2 may be available.

Further, the insulating layer 6 can be formed on the entire surface of the substrate 1, however, the insulating layer 6 can be also arranged only on the cross portion with the second conductive member 7 to be described later.

The insulating layer 6 can be formed by a printing method. As a printing paste to be used for the printing method, an insulating paste and a photosensitive insulating paste can be used. If the photosensitive insulating paste is used, the insulating layer 6 can be formed on a desired pattern.

Figure 11A:
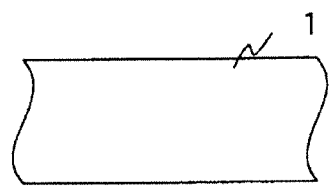
FIGS. 11A to 11H are pattern diagrams showing the manufacturing step of the electron source according to the present invention.
Figure 11B:
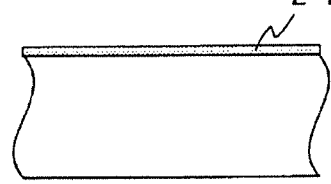
Figure 11C:
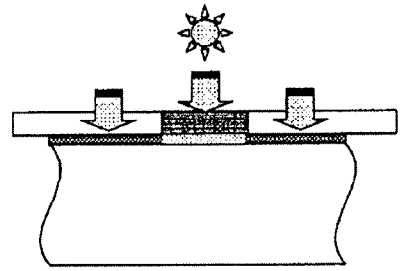
Figure 11D:
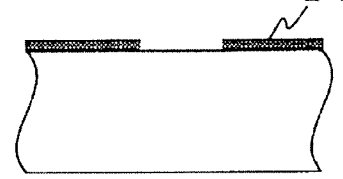
Figure 11E:
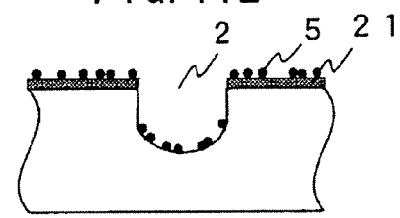
Figure 11F:
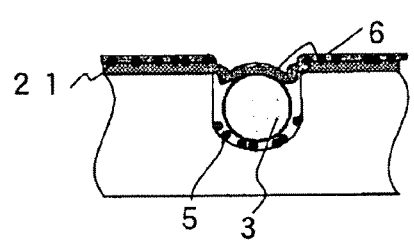
Figure 11G:
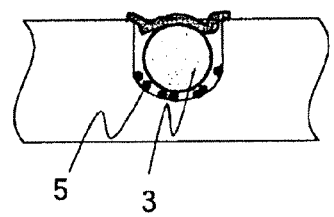
Figure 11H:
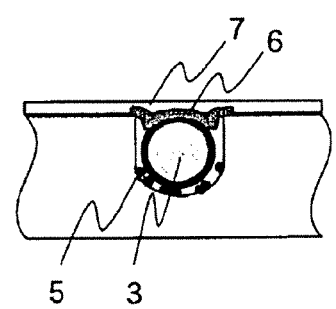

In the case of forming the insulating layer 6 by the silicon oxide, for example, applying silica sol by means of a slit-coater and burning it in an oxygen atmosphere, the insulating layer 6 can be formed (FIG. 11F and FIG. 11G).

(Step 6)

Figure 10H:
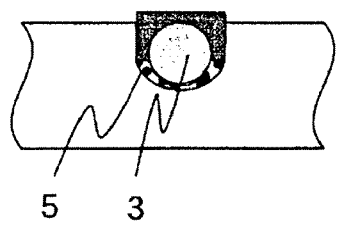

Next, the insulating layer 6 is patterned so that the insulating layer 6 is only left on the cross portion with the second conductive member 7 to be described later (FIG. 10H).

Further, if it is not necessary to pattern the insulating layer 6, the present step can be omitted.

According to a method of patterning the insulating layer 6, the insulating layer 6 can be formed in such a manner that the photosensitive insulating paste is printed and dried in the step 5 (FIG. 10G), then, the photosensitive insulating paste is exposed on a predetermined pattern to be developed, and then, the photosensitive insulating paste is burned. Alternatively, if the resist is not removed in the step 4 (FIG. 10E) to be left, the insulating layer 6 can be patterned by removing the resist after forming the insulating layer 6 on the entire surface of the substrate 1 in the step 5.

In addition, in the case of forming the insulating layer 6 only by the oxide coating of the first conductive member 3, the step 5 and the step 6 can be omitted.

In addition, as shown in FIG. 1 and FIG. 5, in the case of providing the insulating layer 6 so as to almost entirely cover the first conductive member 3, the exposed portion 4 for connecting the first electrode 8 to the first conductive member 3 is disposed in the insulating layer 6. The exposed portion 4 can be formed by removing a part of the insulating layer 6 by polishing or the like.

(Step 7)

Consequently, the electrode pair 10 (the second electrode 10A and the third electrode 10B) is disposed on the surface of the substrate 1 near the groove 2.

The electrode pair 10 can be formed, for example, by disposing a resin film containing a metal forming the electrode pair 10 on the surface of the glass substrate 1 by a predetermined pattern and heating and burning this resin film in the oxygen atmosphere. As a metal forming the electrode pair 10, for example, platinum can be used.

In the case of using the oxide coating of the wire 3 as the insulating film 6, this oxide coating can be formed by the above burning step in the oxygen atmosphere. It is obvious that formation of the oxide coating is not limited to this step. In other words, the oxide coating can be also disposed on the surface of the wire 3 in other step. For example, preparing the wire 3 provided with the oxide coating in advance, this may be arranged in the groove 2 in the step 5. Further, this step 7 can be affected before the step 6.

(Step 8)

Figure 10I:
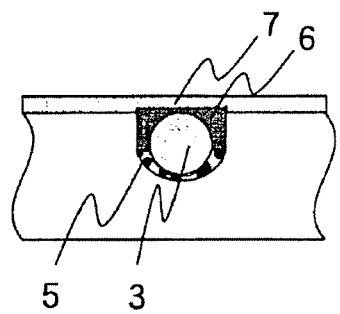

Next, the wiring board provided with the matrix wiring structure can be formed by forming the second conductive member 7 to be connected to the third electrode 10B and the first electrode 8 to be connected to the second electrode 10A (FIG. 10I).

A manufacturing method of the second conductive member 7 and the first electrode 8 is not particularly limited, however, in order to simply form them inexpensively, for example, a method of printing the conductive paste on a predetermined place by the printing method and burning it can be adopted.

According to the above-described steps, an insulating property of the cross portion between the first conductive member 3 and the second conductive member 7 is secured and a stable matrix wiring can be formed by a simple structure with a low resistance.

After that, the conductive film 11 is disposed between the electrode pair 10 in order to form a surface conduction electron-emitting device, then, a publicly-known conducting step such as a forming step and activation step is carried out via the first conductive member 3 and the second conductive member 7. Thus, it is possible to form a good electron source having a high resolution, a little property dispersion, and little change of trajectories of emitted electrons. As one of causes to be able to form a good electron source, it can be considered to stably dispose the first conductive member 3 such as a wire having a wide cross section and a low resistance in the groove 2 and this makes it possible to reduce fluctuation of a voltage to be supplied to each electron-emitting device. In addition, as other cause, it can be considered that wiring with a high-resolution can be made simply because the wire with a low resistance can be arranged in the groove 2 provided on the substrate 1 in advance and an influence of the wiring for the trajectories of the emitted electrons can be reduced because a distance between the upper end of the wiring and the surface of the substrate 1 can be made smaller.

Further, a field emission type electron-emitting device using a carbon fiber such as a carbon nano-tube and a metal-insulator-metal type electron-emitting device can be used as an electron-emitting device which can be applied to the present invention.

EXAMPLE

The example(s) of the present invention will be described below.

First Example

A wire-embedded matrix wiring board shown in FIGS. 1 to 4 is formed by a process shown in a flow chart of FIGS. 10A-10I.

A dry film resist on the glass substrate 1 is accumulated, and the resist 21 of a portion for forming the groove 2 is solved according to a photolithography method. The groove 2 with a width of about 150 μm and a depth of about 120 μm is formed by using a sand blast method. After that, a dry film resist is peeled off.

According to the present example, a $SiO_2$ film is formed on the entire surface on which the groove 2 of the glass substrate 1 is formed according to a spattering method after forming the groove 2. Formation of the $SiO_2$ film can be omitted. However, the $SiO_2$ film is preferable because it can prevent dispersion of alkali harmful to the surface conduction electron-emitting device from the substrate 1.

Next, the spherical-formed particles 5 made of silica having a diameter of 1 μm in an organic solvent are dispersed, and the organic solvent is sprayed by a spray method on the entire surface where the groove 2 of the glass substrate 1 is formed, and not less than 100 to not more than 500 of particles 5 (here, 250 particles per 1 $mm^2$) are arranged per 1 $mm^2$.

This spherical-formed particle 5 serves to support the wire 3 disposed in the groove 2 by a point. In addition, the particle diameter can be appropriately determined in accordance with the diameters of the groove 2 and the wire 3 in order to make a space between the inner wall of the groove 2 and the wire 3.

Consequently, the wire 3 (the scan line) made of the oxygen-free copper having a diameter of 100 μm is arranged in the groove 2. The material of the wire is not particularly limited to the oxygen-free copper if it is a metal having a low resistance rate.

Next, forming the insulating paste having a photosensitive material mixed so as to cover the groove 2 and the arranged wire 3 on the entire surface and forming a pattern provided with a contact hole to be burned by using the photolithography method, the insulating layer 6 having a width of 140 μm and a thickness of 25 μm is formed.

Upon selection of the particle diameter of the particle 5, the particle diameter of the particle 5 is selected so that the insulating paste does not bridge the gap between the inner wall of the groove 2 and the wire 3 completely (namely, a space is formed between the inner wall of the groove 2 and the wire 3) by reducing the gap between the inner wall of the groove 2 and the wire 3 (reducing the particle diameter of the particle 5).

Next, the second electrode 10A and the third electrode 10B made of platinum are formed. Then, a part of the insulating layer 6 is removed so as to be able to connect the second electrode 10A to the wire 3 using the sand blast method (namely, the connection portion is formed) in order to make the contact portion between the second electrode 10A and the wire 3.

Next, the second conductive member 7 (the signal line) is formed by using the printing method with a width of 30 microns and a film thickness of 30 μm so as to be connected to the third electrode 10B by using an Ag paste. In addition, the first electrode 8 connecting the second electrode 10A to the wire 3 is formed using the printing method at the same time as the second conductive member 7 by using the Ag paste.

Next, the conductive film 11 made of Pd is formed between the second electrode 10A and the third electrode 10B by using an ink jet method.

After that, the gap 12 is formed on the conductive film 11 between the electrode pair 10 (namely, the forming processing is carried out) by applying a voltage between the first conductive member 3 and the second conductive member 7.

After that, a carbon film is formed in and near the gap 12 of the conductive film 11 (the activation processing is carried out) by applying a voltage between the first conductive member 3 and the second conductive member 7 in an atmosphere containing a carbon-containing gas.

In the above-described steps, the electron source having the surface conduction electron-emitting device is formed. The electron source provided with a matrix wiring, which is manufactured according to the present example, can prevent the generation of the micro crack on the surface of the glass substrate 1 due to a stress generated in a heating step in a manufacturing process. In addition, in the forming step, the activating step, and further, upon driving, it is possible to prevent peeling-off of the wire 3 from the glass substrate 1 and damage of the glass substrate 1, so that the present wiring board has been capable of being driven well for a long period of time.

Second Example

The wiring board provided with the structures shown in FIGS. 5 to 7 and the electron source are formed in a flow chart of FIG. 11.

As same as the first example, the glass substrate 1 having the groove 2 is formed, and after that, 500 spherical-shaped particles 5 with a diameter of 0.1 μm made of silica are arranged per 1 $mm^2$ on the entire surface where the groove 2 of the glass substrate 1 is formed (FIGS. 11A to 11E).

Then, the wire 3 made of the oxygen-free copper as the scan line is arranged in the groove 2.

Next, a silica coat material is developed by a slit-coating method so as to cover the groove 2 and the wire 3 and the silica coat material is temporarily burnt in air atmosphere (formation of the insulating layer 6). Further, it is confirmed that the gap between the inner wall of the groove 2 and the wire 3 is not bridged by the silica coat material (the gap due to the particle 5 between the inner wall of the groove 2 and the wire 3 is maintained).

After that, the dry film resist 21 is peeled off. In order to manufacture the contact portion for the second electrode 10A, the dry film resist is accumulated again. The resist only on the contact portion is solved due to an exposure and development, and the insulating layer 6 which is made of silica layer is partially removed so that the surface of the wire 3 is exposed only on the contact portion (the exposed portion 4) by using the sand blast method.

Then, the dry film resist is peeled off. Next, the electrode pair 10 made of platinum is formed.

Next, at the same time as the first example, the first electrode 8 and the second conductive member 7 as the signal line are formed by using the Ag paste. Further, after arranging the conductive film 11, the forming processing and the activation processing are carried out to form the electron source, in which many electron-emitting devices are arranged in a matrix.

Then, a face plate 86 provided with a light-emitting member film (a fluorescent film) 84 and a metal back 85 made of aluminum are arranged so as to face the electron source formed as described above, and a display panel shown in FIG. 8 is formed. Then, the image is displayed by appropriately applying a predetermined voltage to each signal line (the second conductive member 7) and each scan line (the first conductive member 3), so that a stable image has been capable of being obtained for a long period of time. In addition, even when a heat is generated upon manufacturing the wiring board and upon driving the wiring board, the wire 3 as the scan line is not peeled off from the glass substrate 1 and a micro crack is not generated on the surface of the glass substrate 1.

As described above, according to the present embodiment, even if the wiring having a large cross section and being similar to a metal of a bulk such as a wire having a low resistance is disposed in the groove 2 formed on the surface of the substrate 1 made of a glass or the like, and even if expansion and contraction in the heating step of the wiring board are caused, it is possible to prevent damage of the substrate 1 and the wiring (the first conductive member 3, the second conductive member 7. As a result, it is possible to form the matrix wiring structure with a low cost from a material side and a process side and a high resolution and it is possible to form an excellent flat panel display.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-183700, filed on Jul. 3, 2006, which is hereby incorporated by reference herein in its entirety.

What is claimed is:

1. An electron source comprising:
   a wiring board including:
   a substrate having a groove on its surface;
   a first conductive member which is arranged along the groove and in the groove, wherein an extending direction of the first conductive member is the same as that of the groove, and a width of the first conductive member is smaller than that of the groove; and
   a second conductive member which is arranged above the first conductive member crossing the first conductive member; and
   an electron-emitting device which is arranged on the wiring board and is electrically connected to the first conductive member and the second conductive member;
   wherein a particle is arranged between the first conductive member and an inner wall of the groove.

2. An electron source according to claim 1, wherein a value of a thermal expansion coefficient of the particle is in the range of a value of a thermal expansion coefficient of the first conductive member to a value of a thermal expansion coefficient of the substrate.

3. An electron source according to claim 1, wherein a particle diameter of the particle is not less than 0.01 µm and not more than 5 µm.

4. An electron source according to claim 1, wherein the first conductive member is a conductive wire containing a metal.

5. An electron source according to claim 4, wherein the metal is any one of Cu, Ni, and Al.

6. An electron source according to claim 4, wherein the particle is arranged between a periphery of the conductive wire containing the metal and the inner wall of the groove so as to separate a periphery of the conductive wire containing the metal from the inner wall of the groove, and wherein a diameter of the particle is smaller than a diameter of the conductive wire containing the metal.

7. An image display apparatus comprising:
   an electron source according to claim 1, and
   a light-emitting member for emitting a light by irradiation with electrons emitted from the electron source.

8. An image reproducing apparatus comprising:
   an image display apparatus according to claim 7, and
   a receiver, which is connected to the image display apparatus, for receiving at least one of a broadcast signal and a signal transmitted via an electric communication line.

9. A wiring board comprising:
   a substrate including a groove on its surface; and
   a first conductive member which is arranged along the groove and in the groove, wherein an extending direction of the first conductive member is the same as that of the groove, and a width of the first conductive member is smaller than that of the groove;
   wherein a particle is arranged between the first conductive member and an inner wall of the groove.

10. A wiring board according to claim 9, wherein a value of a thermal expansion coefficient of the particle is in the range of a value of a thermal expansion coefficient of the first conductive member to a value of a thermal expansion coefficient of the substrate.

11. A wiring board according to claim 9, wherein a particle diameter of the particle is not less than 0.01 µm and not more than 5 µm.

12. The wiring board according to claim 9, wherein the first conductive member is a conductive wire containing a metal.

13. A wiring board according to claim 12, wherein the metal is any one of Cu, Ni, and Al.

14. A wiring board according to claim 12, wherein the particle is arranged between a periphery of the conductive wire containing the metal and the inner wall of the groove so as to separate a periphery of the conductive wire containing the metal from the inner wall of the groove, and wherein a diameter of the particle is smaller than a diameter of the conductive wire containing the metal.

15. An electronic device comprising:
    the wiring board according to claim 9.

* * * * *